United States Patent

[11] 3,627,140

[72] Inventor Florian F. Yanikoski
Braintree, Mass.
[21] Appl. No. 38,090
[22] Filed May 18, 1970
[45] Patented Dec. 14, 1971
[73] Assignee Eastman Kodak Company
Rochester, N.Y.

[54] PRINTED CIRCUIT CARD RACK
4 Claims, 5 Drawing Figs.

[52] U.S. Cl. ........ 211/41, 317/101 R
[51] Int. Cl. ........ A47g 19/08
[50] Field of Search ........ 211/41, 40, 44, 20; 206/62; 339/17, 75, 176; 40/124, 106.1, 124.2, 36, 79, 78

[56] References Cited

UNITED STATES PATENTS

| | | | |
|---|---|---|---|
| 2,702,127 | 2/1955 | Pastorius | 211/41 |
| 2,832,013 | 4/1958 | Pedersen | 339/17 X |
| 2,986,281 | 5/1961 | Jordan | 211/41 |
| 3,014,594 | 12/1961 | Kerstner | 211/41 |
| 3,016,148 | 1/1962 | Riddle | 211/41 |
| 3,017,232 | 1/1962 | Schwab | 211/41 X |
| 3,416,250 | 12/1968 | Schweers | 40/79 |

*Primary Examiner*—Nile C. Byers, Jr.
*Attorneys*—John D. Husser and Robert W. Hampton

ABSTRACT: A rack for supporting a plurality of printed circuit cards in vertically stacked relation is formed by a pair of plates having U-shaped cross sections. Each plate has a wall member arranged in spaced-parallel relation to the other such member and a pair of outwardly turned flange members. Both wall members have a series of guide slots cut therethrough which are correspondingly paired and vertically aligned for slidably receiving opposite ends of the individual cards. The guide slots have enlarged opposite ends that respectively define a series of apertures which communicate with the flange members in a manner facilitating receipt of the cards.

FLORIAN F. YANIKOSKI
INVENTOR.

BY John D. Hussey
Robert W Hampton
ATTORNEYS

FLORIAN F. YANIKOSKI
*INVENTOR.*

BY John D. Husser
Robert W. Hampton

ATTORNEYS

PRINTED CIRCUIT CARD RACK

BACKGROUND OF THE INVENTION

1. Field of the Invention

The present invention relates to a printed circuit card carrier and, more particularly to a novel and improved rack for removably supporting a plurality of printed circuit cards in vertically stacked relation.

2. Description of the Prior Art

The commercial development of complex and compact electronic circuits has necessarily resulted in the dividing of these circuits into subassemblies or modules in order to facilitate manufacture and subsequent maintenance and repair. The printed circuit card or board which has been developed effects a relatively inexpensive method of mounting and interconnecting electronic circuitry as subassemblies or modules for subsequent insertion into a unit designed to make use of this circuitry. In order to facilitate the construction, reduce the manufacturing costs and the like, the circuit cards or boards are frequently formed with common modular dimensions such that each has a predetermined width and length and is provided with a selected number of similarly distributed electrical terminals along one edge. These terminals are extensions of the printed circuitry which is fixed on the surface or disposed within the card. The cards are connected into circuit with each other and other components by plugging the card terminals into an appropriately wired electrical connector or the like which is frequently located on the unit utilizing such cards.

Racks or supports for the printed circuit cards or boards have been suggested. Generally, these racks heretofore suggested have been found to be relatively costly particularly as to initial manufacture and assembly. This tends to restrict the use of such racks to applications which require a small number of racks. Where a substantial number of racks is needed, the problem of cost and assembly of the racks into a total support for the cards becomes very significant.

Generally, the racks or supports which are presently available are designed to slidingly receive the printed circuit cards or boards side by side in spaced-parallel relation. It is essential that these racks be designed to easily receive each card and yet be relatively inexpensive to manufacture and assemble. Heretofore, guide slots, guide rails or the like have been devised to facilitate insertion of a card into the rack; however, such card-guiding means are structural components of the rack that is separately manufactured for subsequent assembly with the rack. Such practice significantly adds to the assembly cost of these racks and consequently can make their use prohibitive.

SUMMARY OF THE INVENTION

Accordingly, it is an object of the present invention to provide a novel and improved rack for supporting a plurality of printed circuit cards or boards in stacked relation.

Another object of the present invention is to provide a printed circuit card rack which employs a minimum number of parts all of which may be readily mass produced and which require a minimum amount of assembly, expense and labor.

Still another object of the present invention is to provide a printed circuit card rack in which the individual cards will slide easily into the rack and can readily be removed therefrom.

Yet another object of the present invention is to provide a novel and improved method of assembling a printed circuit card rack.

And yet another object of the present invention is to provide an article of manufacture which is easy to construct, economical to manufacture and can be assembled to form a printed circuit card rack.

In accordance with a preferred embodiment of the present invention there is provided a rack for supporting a plurality of printed circuit cards or boards in vertically stacked relation. Such a rack can be assembled by bending a pair of plates, originally of flat rectangular figure, in a manner such that a U-shaped cross section is formed. Respective plates, when U-shaped in cross section, have a wall member which can then be supported in spaced-parallel relation to the other such member so that a pair of flange portions on each member is outwardly turned. Both wall members have a series of transversely extending guide slots which have been cut through the plates when in their flat rectangular shape so that such slots, when the wall members are supported in spaced parallel relation, can be correspondingly paired and vertically aligned for slidingly receiving opposite ends of the individual cards or boards. The guide slots each have enlarged opposite ends that respectively define a longitudinally extending series of apertures; and the apertures respectively communicate with one of the outwardly turned flange portions in a manner facilitating insertion of the cards in such slots.

As will be described more fully hereinafter, the printed circuit card rack in accordance with a particularly novel concept and feature of the present invention is manufactured in an unassembled state, i.e. a pair of the flat rectangular plates with appropriate slots and apertures cut therein, and is thereafter modified in shape and assembled to form an operational rack.

BRIEF DESCRIPTION OF THE DRAWING

The above-mentioned and other features and objects of the present invention and the manner of obtaining them will become more apparent by reference to the following detailed description of the preferred embodiment of the present invention taken in conjunction with the accompanying drawings, wherein.

DESCRIPTION OF THE PREFERRED EMBODIMENT

Figure 2:
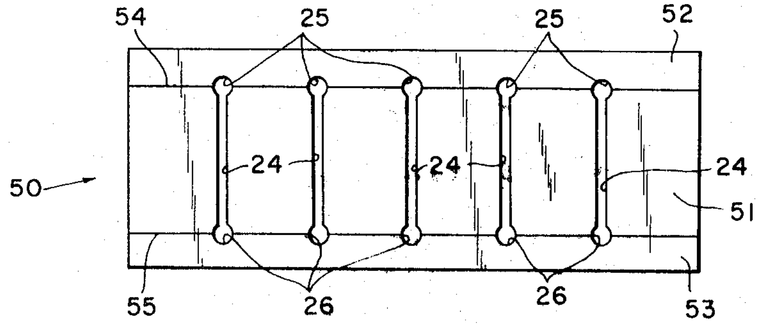
FIG. 2 is a plan view of a flat rectangular plate which can, together with another such plate, be assembled to form the printed circuit card rack depicted in FIG. 1.
Figure 1:
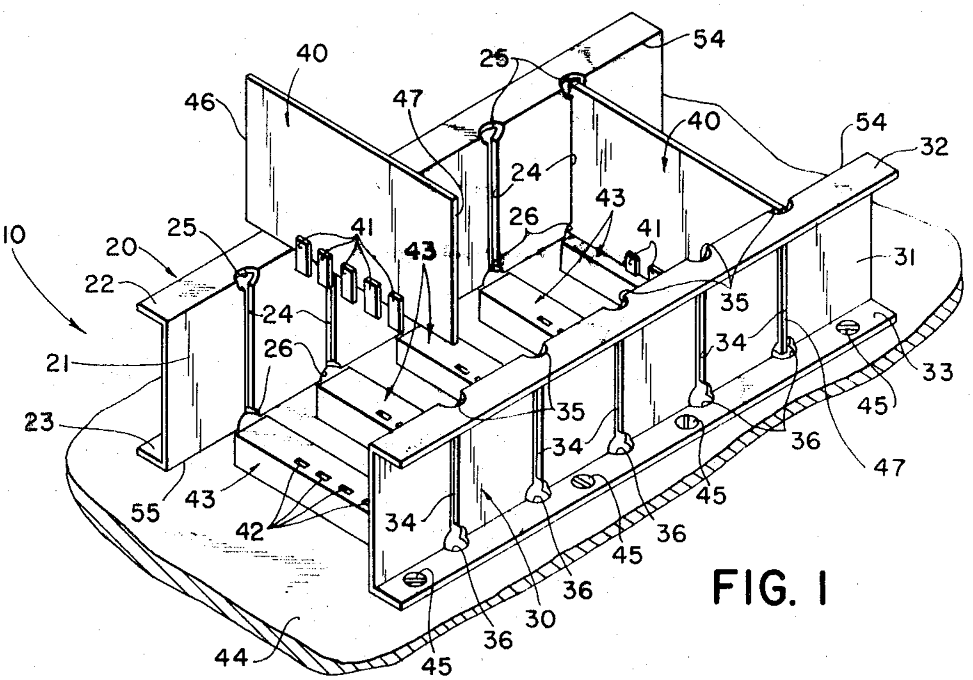
FIG. 1 is a perspective view of a printed circuit card rack and a pair of printed circuit cards in accordance with one embodiment of the present invention, showing the manner in which the cards are supported and can be slidingly received by the rack.

Referring now to the drawings and in particular to FIG. 1, there is shown a rack 10 for supporting a plurality of printed circuit cards or boards in vertically stacked relation. The cards or boards, generally indicated by the reference numeral 40, are of the conventional kind having a printed electrical circuit (not shown) mounted thereon which concludes in a series of plug-in type terminal connectors 41. Such connectors are longitudinally spaced along one edge of each card in accordance with the spacing of openings 42 in electrical connector mountings 43. The connectors 43 form part of a unit 44 which can be any apparatus that is designed to make use of the plug-in type printed circuit cards 40. When fully inserted in the rack 10, as shown in FIG. 1, each card will make electrical contact with a connector 43 in conventional fashion.

One application of the rack 10 is apparent from FIG. 1, wherein a pair of plates 20 and 30, respectively having U-shaped cross sections, are supported in spaced-parallel relation by fasteners 45 which fix such plates to the unit 44. The plates 20 and 30 respectively comprise wall members 21 and 31 and outwardly turned flange members 22, 23 and 32, 33. Wall members 21 and 31 respectively have a series of parallel-spaced, transversely extending guide slots 24 and 34 cut therethrough; and as can be seen in FIG. 1, the guide slots 24 and 34 are arranged in correspondingly located pairs and vertically aligned for slidingly receiving the opposite edges 46 and 47 of individual cards 40. The guide slots 24 and 34 each have enlarged opposite ends that respectively define a longitudinally extending series of apertures 25, 26 or 35, 36 as shown. These apertures are of greater width than the width of the guide slots and are tapered in directions which extend toward respective ones of the guide slots. Moreover, the apertures 25 respectively communicate with the flange portions 22, as do the remaining apertures and flange portions in the manner shown in FIG. 1. Such communication of the apertures and the flanges is significant in that this novel structural arrangement facilitates sliding insertion of the cards 40 in the respective slots 24 and 34 and, as will be described hereinafter, allows for manufacture of the rack 10 in an unassembled state thereby enabling such racks to be mass produced with a minimum amount of assembly, expense and labor.

Referring now in particular to FIG. 1, there is shown a plate 50 which is the same as the plates 20 and 30 but for the cross-sectional shape. That is to say, the plate 50 is of a flat rectangular configuration, whereas the plates 20 and 30 are U-shaped as described above. The plate 50 may be molded from plastics material, machined from a solid block of metal or plastics material, stamped from metal or plastics sheet, or the like. As can be seen in FIG. 1, the plate 50 has a series of guide slots 24 (or for that matter 34) and apertures 25 and 26 (or for that matter 35 and 36) as hereinbefore described in detail. Grooves 54 and 55 are respectively cut into the plate 50 and longitudinally extend through the apertures 25 and 26, preferably at their centers, so that as should now be apparent plate edge portions 52 and 53 can be bent away from the plane defined by plate central portion 51 to form a U-shaped plate, such as the plate 20 or 30. Thereafter, a pair of such formed plates can be secured to the unit 44 by the fasteners 45, in the manner shown by FIG. 1; or can otherwise be supported in spaced relation, as shown in FIG. 3, by applying fasteners 17 to secure end panels 12 to the plates 20 and 30 so as to form a rigid rack structure 13.

Figure 3:
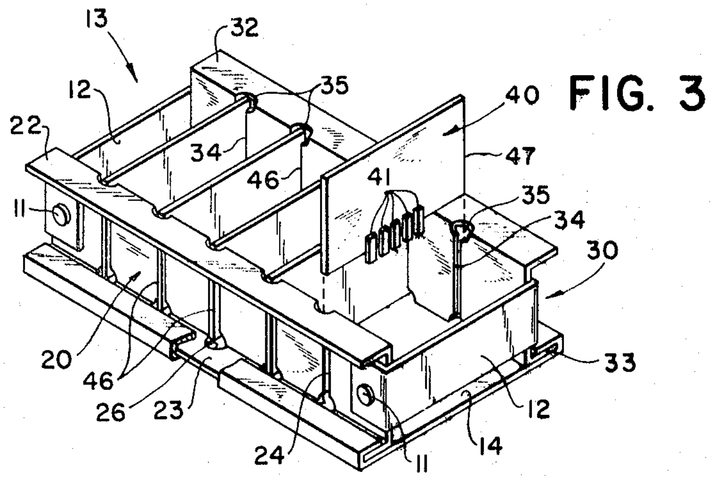
FIG. 3 is a perspective view of the printed circuit card rack and a plurality of printed circuit cards in accordance with a modified embodiment of the present invention.

Should one wish to transport the rack 13, shown in FIG. 3, a bottom panel 14 may be slidingly attached to the plates 20 and 30 in order to provide a support base for the printed circuit cards 40.

Figure 4:
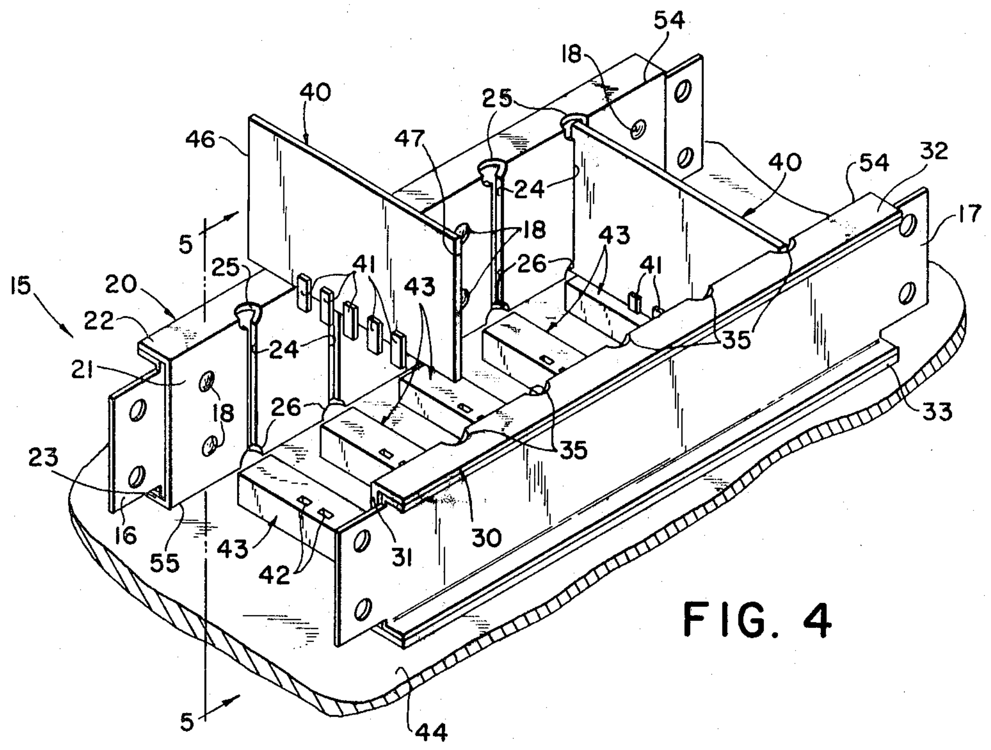
FIG. 4 is a perspective view of the printed circuit card rack with a plurality of printed circuit cards in accordance with another modified embodiment of the present invention.
Figure 5:
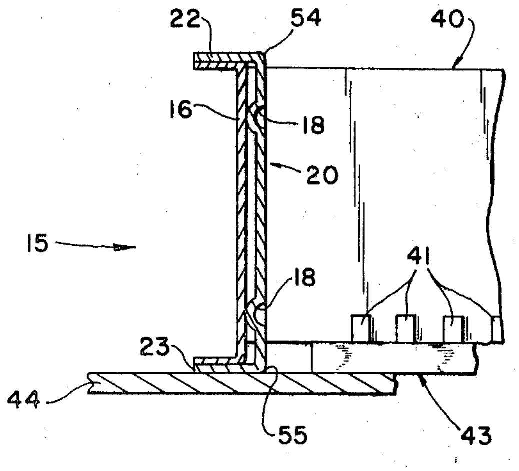
FIG. 5 is a cross-sectional view taken along the line 5—5 of FIG. 4.

Referring now to FIGS. 4 and 5, there is shown a modified rack 15 wherein a pair of side panels 16 and 17 are respectively secured to the plates 20 and 30 by suitable means (not shown). As can be seen in FIG. 5, each plate has a series of raised portions 18 which serve to separate respectively secured ones of the side panels and plates, whereby each side panel can act as a guide for a respective one of the opposite edges 46 and 47 of the individual printed circuit cards 40.

It can now be appreciated that the present invention provides an article of manufacture such as the plate 50 which may be readily mass produced, and can easily be reshaped for assembly of a printed circuit card rack with a minimum amount of assembly, expense and labor. Moreover, although the plates 20 and 30 are described as having two series of apertures 25, 26 and 35, 36 respectively, it should be understood that only one set of such apertures for each plate is necessary; and that such apertures though shown as having a circular configuration, can alternatively take other shapes.

The present invention has been described in detail with particular reference to a preferred embodiment thereof, but it will be understood that variations and modifications can be effected within the spirit and scope of the invention.

I claim:

1. A rack for a plurality of printed circuit cards, which comprises:

first and second substantially rectangular wall members, each of said wall members having a longitudinally extending flange portion along one edge thereof;

means supporting said wall members in spaced-parallel relation in a manner such that their respective flange portions are outwardly turned;

means defining a plurality of transversely extending slots in each of said wall members and into which such cards are respectively slidingly receivable, each of said slots in said first wall member being correspondingly aligned with each of said slots in said second wall member in a manner for respectively supporting such cards therebetween in stacked relation; and means defining a longitudinally extending series of apertures in each of said wall members, each of said apertures respectively communicating with said slots and one of said flange portions.

2. A rack for a plurality of printed circuit cards as recited in claim 1, wherein:

each of said slots has a pair of opposite ends, at least one of said opposite ends being enlarged relative to the width of said slots to respectively define said apertures; and each of said apertures being tapered toward a respective one of said slots.

3. An article of manufacture to be included in the assembly of a rack for a plurality of cards, which comprises:

a plate, said plate having a central portion and a pair of opposite edge portions, said edge portions being spaced from each other by said central portion;

means defining a pair of grooves in said plate, said grooves respectively separating said edge portions from said central portion;

means defining a series of slots in said plate, each of said slots extending across said central portion toward said grooves and being shaped to slidingly receive a card; and means defining a series of apertures in said plate, each of said apertures being disposed in spaced relation along one of said grooves and respectively communicating with said slots.

4. An article of manufacture as recited in claim 3, wherein:

each of said slots is arranged in substantially parallel-spaced relation and has a pair of opposite ends, at least one of said opposite ends being enlarged relative to the width of said slots to respectively define said apertures; and each of said apertures being tapered toward a respective one of said slots.

* * * * *